United States Patent
Li et al.

(10) Patent No.: US 9,590,590 B2
(45) Date of Patent: Mar. 7, 2017

(54) DELTA-SIGMA MODULATOR HAVING TRANSCONDUCTOR NETWORK FOR DYNAMICALLY TUNING LOOP FILTER COEFFICIENTS

(71) Applicant: ANALOG DEVICES GLOBAL, Hamilton (BM)

(72) Inventors: Hongxing Li, Andover, MA (US); Niall Kevin Kearney, Cork (IE); Keith O'Donoghue, Carrigaline (IE)

(73) Assignee: Analog Devices Global, Hamilton (BM)

( * ) Notice: Subject to any disclaimer, the term of this patent is extended or adjusted under 35 U.S.C. 154(b) by 0 days.

(21) Appl. No.: 14/537,836

(22) Filed: Nov. 10, 2014

(65) Prior Publication Data
US 2016/0134301 A1    May 12, 2016

(51) Int. Cl.
*H03M 1/10*      (2006.01)
*H03H 11/04*     (2006.01)
*H03M 3/00*      (2006.01)

(52) U.S. Cl.
CPC ........ *H03H 11/0422* (2013.01); *H03M 3/396* (2013.01); *H03M 3/422* (2013.01); *H03M 3/438* (2013.01); *H03M 3/458* (2013.01)

(58) Field of Classification Search
CPC ........ H03M 3/38; H03M 3/424; H03M 3/458; H03M 3/396; H03M 3/422; H03M 3/438; H03H 11/0422
USPC .................................................. 341/143, 120
See application file for complete search history.

(56) References Cited

U.S. PATENT DOCUMENTS

| | | | |
|---|---|---|---|
| 5,729,230 A | 3/1998 | Jensen et al. | |
| 6,396,428 B1 | 5/2002 | Cheng | |
| 6,466,096 B1 * | 10/2002 | DeVito | H03L 7/087 327/156 |
| 6,876,698 B1 * | 4/2005 | Dick | H03H 17/0235 341/143 |
| 6,975,259 B1 | 12/2005 | Jensen | |
| 7,095,345 B2 * | 8/2006 | Nguyen | H03M 3/386 341/120 |

(Continued)

FOREIGN PATENT DOCUMENTS

| | | |
|---|---|---|
| WO | 2009/074470 | 6/2009 |
| WO | 2014/127821 | 8/2014 |

OTHER PUBLICATIONS

Office Action issued in TW Patent Application Serial No. 104135208 mailed Sep. 26, 2016, 9 pages.
English Summary of Office Action issued in TW Patent Application Serial No. 104135208 mailed Sep. 26, 2016, 7 pages.

(Continued)

*Primary Examiner* — Brian Young
(74) *Attorney, Agent, or Firm* — Patent Capital Group

(57) ABSTRACT

A dynamically tunable transconductor includes a voltage-to-current converter stage for generating a current signal based on a voltage signal; and a current scaling stage for scaling the current signal by a scaling factor to achieve a particular transconductance. Current scaling stage includes a coarse tune mechanism having an associated coarse tune step and a fine tune mechanism having an associated fine tune step, where the scaling factor is a ratio of the coarse tune step to the fine tune step. A delta-sigma modulator can implement the transconductor to generate loop filter coefficients by dynamically tuning the transconductance to achieve a particular resistance.

30 Claims, 9 Drawing Sheets

(56) References Cited

U.S. PATENT DOCUMENTS

| | | | |
|---|---|---|---|
| 7,176,819 B1* | 2/2007 | Swerlein | H03M 3/322 |
| | | | 341/143 |
| 7,193,546 B1 | 3/2007 | Melanson | |
| 7,215,270 B1 | 5/2007 | Kozak et al. | |
| 7,362,252 B1 | 4/2008 | Pai | |
| 7,420,493 B2 | 9/2008 | Hochschild | |
| 7,439,891 B2 | 10/2008 | Kozak et al. | |
| 7,486,214 B1* | 2/2009 | Di Giandomenico | H03M 3/386 |
| | | | 327/552 |
| 7,551,029 B2 | 6/2009 | Pan | |
| 8,223,050 B2 | 7/2012 | Matsumoto et al. | |
| 8,378,751 B2* | 2/2013 | Fagg | H03L 7/185 |
| | | | 331/10 |
| 8,477,886 B2 | 7/2013 | Lindoff et al. | |
| 8,519,878 B2 | 8/2013 | Jensen et al. | |
| 8,742,790 B1 | 6/2014 | Roo et al. | |
| 9,246,509 B1* | 1/2016 | Bhargava | H03M 3/412 |
| 9,325,340 B2* | 4/2016 | Gonen | H03M 1/14 |
| 2013/0278453 A1 | 10/2013 | Steensgaard-Madson | |
| 2013/0331052 A1 | 12/2013 | Jensen et al. | |

OTHER PUBLICATIONS

Miland Subhash Sawant et al., *Linear Compact CMOS OTA with Multidecade Tuning, -62dB IM3, - 75dB SFDR, Constant Input Range and Two Independent Degrees of Freedom for Gain Adjustment*, © 2006, IEEE, 0/7803-9390-2/06, 4 pages.

Antonio J. Lopez-Martin et al., *CMOS Transconductors with Continuous Tuning Using FGMOS Balanced Output Current Scaling*, IEEE Journal of Solid-State Circuits, vol. 43, No. 5, May 2008, 11 pages.

Miland Subhash Sawant et al., *Wide gm Adjustment Range Highly Linear OTA with Programmable Mirrors Operating in Triode Mode*, © 2005, IEEE, 0/7803-9197-7/05, 3 pages.

Meghraj Kachare et al., *New Low-Voltage Fully Programmable CMOS Triangular/Trapezoidal Function Generator Circuit*, IEEE Transactions on Circuits and Systems-1: Regular Papers, vol. 52, No. 10, Oct. 2005, 10 pages.

Kirk C.-H. Chao et al., *A Higher Order Topology for Interpolative Modulators for Oversampling A/D Converters*, IEEE Transactions on Circuits and Systems, vol. 37, No. 3, Mar. 1990, 10 pages.

James A. Cherry et al., *Continuous-Time Delta-Sigma Modulators for High-Speed A/D Conversion—Theory, Practice and Fundamental Performance Limits*, 2002, 4 pages.

\* cited by examiner

DELTA-SIGMA MODULATOR HAVING TRANSCONDUCTOR NETWORK FOR DYNAMICALLY TUNING LOOP FILTER COEFFICIENTS

TECHNICAL FIELD

The present disclosure relates generally to delta-sigma modulators, and more particularly, to delta-sigma modulators for dynamically tuning loop filter coefficients.

BACKGROUND

A delta-sigma (ΔΣ) modulator is a feedback system that can achieve high-resolution digital signals. The delta-sigma modulator has been implemented in a wide variety of electronic circuits, including but not limited to, analog-to-digital converters (ADCs), digital-to-analog converters (DACs), frequency synthesizers, and other electronic circuits. Delta-sigma modulators are often configured to tune loop filter coefficients, for example, to control frequency distribution of quantization noise, shaping (moving) any quantization noise to higher and/or lower frequencies to achieve a virtually noise-free region. Although known delta-sigma modulator configurations for tuning loop filter coefficients have been generally adequate for such purposes, they have not been entirely satisfactory in all respects.

BRIEF DESCRIPTION OF DRAWINGS

The present disclosure is best understood from the following detailed description when read with the accompanying figures. It is emphasized that, in accordance with the standard practice in the industry, various features are not drawn to scale and are used for illustration purposes only. In fact, the dimension of the various features may be arbitrarily increased or reduced for clarity of discussion.

OVERVIEW OF EXAMPLE EMBODIMENTS

Figure 1:
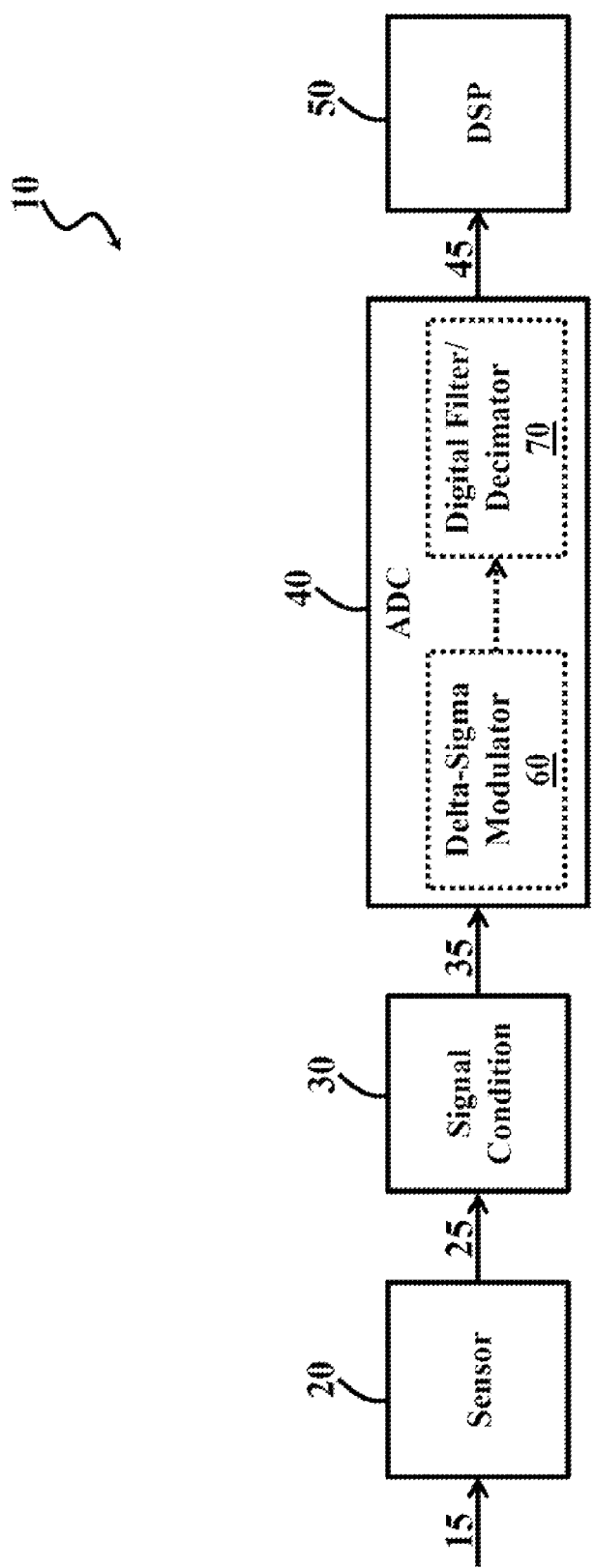
FIG. 1 is a schematic block diagram of an exemplary data acquisition system according to various aspects of the present disclosure.

Dynamically tunable transconductors and associated methods for dynamically tuning transconductance are disclosed herein. An exemplary dynamically tunable transconductor includes a voltage-to-current converter stage for generating a current signal based on a voltage signal; and a current scaling stage for scaling the current signal by a scaling factor to achieve a particular transconductance. Current scaling stage includes a coarse tune mechanism having an associated coarse tune step and a fine tune mechanism having an associated fine tune step, where the scaling factor is a ratio of the coarse tune step to the fine tune step. The voltage-to-current converter stage can include a resistor array having a fixed resistance. The coarse tune mechanism can include a coarse tune transistor array that includes coarse tune transistors configured for selective switching in or out of the coarse tune transistor array to set the coarse tune step. The fine tune mechanism can include a fine tune transistor array that includes fine tune transistors configured for selective switching in or out of the fine tune transistor array to set the fine tune step. In various implementations, the transistor is configured to receive at least two input signals, where the voltage-to-current converter stage sets a current ratio of the at least two input signals.

In various implementations, the transconductor further includes a feedback path from the current scaling stage to the voltage-to-current converter stage, where the feedback path is configured to maintain low impedance. The feedback path can include a transistor having a source coupled with the voltage-to-converter stage and a drain coupled with the current scaling stage. In various implementations, the current scaling stage includes a coarse tune transistor array having coarse tune transistors, where each coarse tune transistor has a source coupled with an output of the transconductor via a switch, a drain coupled with ground, and a gate coupled with the drain of the transistor. In various implementations, a fine tune transistor array having fine tune transistors, where each fine tune transistor has a source coupled with the voltage-to-current converter stage via a switch, a drain coupled with ground, and a gate coupled with the drain of the transistor.

Delta-sigma modulators can implement the transconductor to generate loop filter coefficients by dynamically tuning the transconductance to achieve a particular resistance. In various implementations, delta-sigma modulators described herein can dynamically tune loop filter coefficients to place notch frequencies. Delta-sigma modulators can be implemented with a digital filter/decimator to form a delta-sigma analog-to-digital converter. An exemplary delta-sigma modulator includes a loop filter configured to generate a loop filter analog signal based on an analog input signal, a feedback analog signal, and a loop filter coefficient; a quantizer coupled with the loop filter, where the quantizer is configured to generate a digital signal based on the loop filter analog signal; a transconductor as described herein coupled with the loop filter, where the transconductor is configured to generate the loop filter coefficient by dynamically tuning a transconductance to achieve a particular resistance; and a digital-to-analog converter coupled with the quantizer and the loop filter, the digital-to-analog converter configured to generate the feedback analog signal based on the digital signal. In various implementations, the coarse tune step sets a resistance sub-range that includes the particular resistance for setting the loop filter coefficient, and the fine tune step sets the particular resistance within the resistance sub-range. In various implementations, the transconductor is configured to generate the loop filter coefficient based on at least two input signals received from the loop filter, wherein the voltage-to-current converter stage sets a current ratio of the at least two input signals. In various implementations, the analog input signal has an associated intermediate frequency (IF), and the transconductor is configured to generate a loop filter coefficient that places a notch frequency in a noise transfer function at about the IF frequency. In various implementations, the transconductor forms a feedback path configured to emulate an integrated difference signal generated by an nth integrator of the loop filter.

In various implementations, the loop filter includes a first summer configured to generate a difference signal based on the analog input signal, the feedback analog signal, and the loop filter coefficient; a first integrator coupled with the first summer, wherein the first integrator is configured to generate a first integrated difference signal based on the difference signal; a second integrator coupled with the first integrator, wherein the second integrator is configured to generate a second integrated difference signal based on the first integrated difference signal; and a second summer coupled with the second integrator, wherein the second summer is configured to generate the loop filter analog signal based on the second integrated difference signal. The transconductor may be configured to generate the loop filter coefficient based on the first integrated difference signal and the loop filter analog signal received from the loop filter. The second integrator can include a feed forward gain path configured to generate an integrated gain signal, wherein the second summer is configured to generate the loop filter analog signal further based on the integrated gain signal.

A method can include dynamically tuning a transconductance to achieve a particular resistance for setting a loop filter coefficient for a loop filter of the delta-sigma modulator; generating a loop filter analog signal based on an analog signal, a feedback analog signal, and the loop filter coefficient; and generating a digital signal based on the loop filter analog signal. Dynamically tuning the transconductance can include generating a current signal based on an input signal received from the loop filter, and scaling the current signal by setting a coarse tune step and a fine tune step of a scaling factor to achieve the particular resistance, wherein the scaling factor is a ratio of the coarse tune step to the fine tune step. In various implementations, the analog signal has an associated intermediate frequency (IF), and the method includes setting the loop filter coefficient to place a notch frequency of the delta-sigma modulator at about the IF frequency. The method can further include selectively switching transistors in or out of a transistor array to set the coarse tune step and the fine tune step.

DETAILED DESCRIPTION OF EXAMPLE EMBODIMENTS

A delta-sigma (ΔΣ) modulator is a feedback system that can achieve high-resolution digital signals. The delta-sigma modulator has been implemented in a wide variety of electronic circuits, including but not limited to, analog-to-digital converters (ADCs), digital-to-analog converters (DACs), frequency synthesizers, and other electronic circuits. FIG. 1 is a schematic block diagram of an exemplary data acquisition system 10, which can implement a delta-sigma modulator, according to various aspects of the present disclosure. Data acquisition system 10 is an electronic device (including an electronic circuit and/or one or more components) configured to convert signals (such as analog signals) into a usable form. In various implementations, data acquisition system 10 converts physical conditions into digital form, which can be stored and/or analyzed. FIG. 1 has been simplified for the sake of clarity to better understand the inventive concepts of the present disclosure. Additional features can be added in data acquisition system 10, and some of the features described can be replaced or eliminated in other embodiments of data acquisition system 10.

In FIG. 1, data acquisition system 10 includes an input signal 15 that represents a physical quantity, such as temperature, pressure, velocity, flow rate, position, other physical quantity, or combination thereof. A sensor circuit block 20 receives input signal 20 and converts the physical quantity (represented by input signal 15) into an electrical signal, such as an analog signal 25. Analog signal 25 can be a voltage or current that represents the physical quantity (represented by the input signal 15). A signal conditioning circuit block 30 receives and adjusts analog signal 25 within an acceptable range of an analog-to-digital converter (ADC), providing conditioned analog signal 35. The ADC can be provided at ADC circuit block 40, such that signal conditioning circuit block 30 acts as an interface between sensor circuit block 20 and ADC circuit block 40, conditioning analog signal 25 (and thus providing conditioned analog signal 35) before ADC circuit block 40 digitizes the analog signal. Signal conditioning circuit block 30 can amplify, attenuate, filter, and/or perform other conditioning functions to the analog signal 25. ADC circuit block 40 receives and converts the conditioned analog signal 35 into digital form, providing digital signal 45. The digital signal 45 represents the physical quantity received by the sensor via input signal 15. A digital signal processor (DSP) circuit block 50 can receive and process digital signal 45.

In various implementations, ADC circuit block 40 includes a delta-sigma ADC that generates a digital signal using a feedback technique, where delta-sigma ADC can oversample its input signal (here, conditioned analog signal 35) and perform noise-shaping to achieve a high-resolution digital signal (here, digital signal 45). Delta-sigma ADC can include a delta-sigma modulator 60 and a digital filter/decimator 70. Delta-sigma modulator 60 can use oversampling (for example, a sampling rate above Nyquist rate) and filtering to generate a digital signal that represents the input signal received by the delta-sigma ADC (such as conditioned analog signal 35). In various implementations, delta-sigma ADC measures a difference between conditioned analog signal 35 and a feedback signal, such as that provided by delta-sigma modulator 60. Digital filter/decimator 70 can attenuate noise and/or slow a data rate (for example, to a Nyquist sampling rate) of the digital signal, providing digital signal 45. Digital filter/decimator 70 can include a digital filter, a decimator, or both. The digital filter can attenuate the digital signal received from delta-sigma modulator 60, and the decimator can reduce a sampling rate of the digital signal received from delta-sigma modulator 60.

Figure 2:
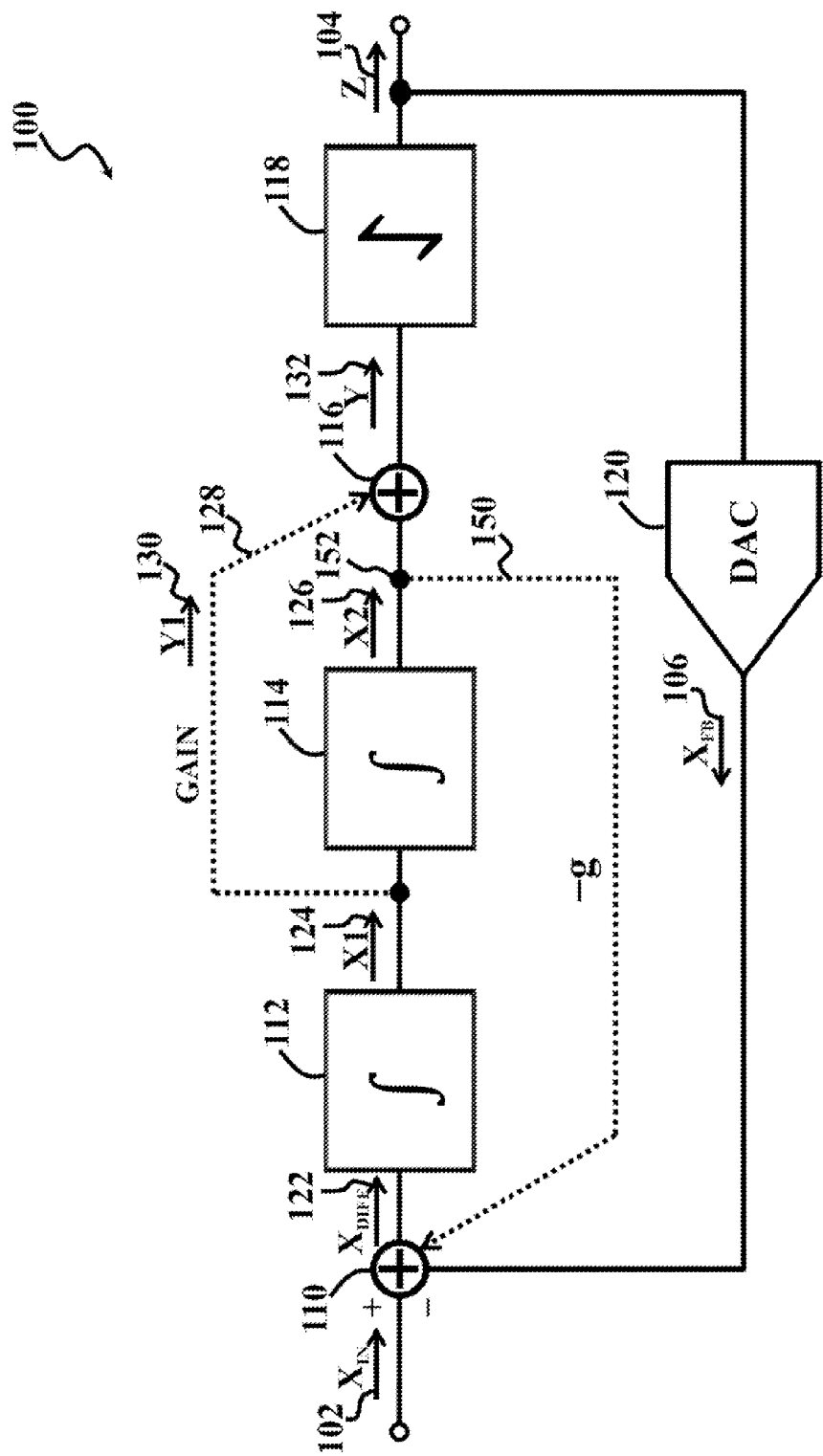
FIG. 2 is a schematic circuit diagram of an exemplary delta-sigma modulator according to various aspects of the present disclosure.

FIG. 2 is a simplified schematic circuit diagram of an exemplary delta-sigma modulator 100 according to various aspects of the present disclosure. Delta-sigma modulator 100 is an electronic device (including an electronic circuit and/or one or more components) configured to convert an input signal 102, such as an analog signal, into an output signal 104, such as a digital signal. In various implementations, delta-sigma modulator 100 is a continuous time delta-sigma modulator. FIG. 2 has been simplified for the sake of clarity to better understand the inventive concepts of the present disclosure. Additional features can be added in delta-sigma modulator 100, and some of the features described can be replaced or eliminated in other embodiments of delta-sigma modulator 100.

For ease of discussion, in the depicted embodiment, delta-sigma modulator 100 represents a second-order delta-sigma modulator, though the present disclosure contemplates that techniques described herein are applicable to any order delta-sigma modulator. Delta-sigma modulator 100 includes a feed forward path for oversampling and noise shaping input signal 102 (such as an analog input signal $X_{IN}$) to generate output signal 104 (such as a digital signal Z). When converting input signal 102 into output signal 104, quantization error (also referred to as quantization noise) arises between input signal 102 and output signal 104. To minimize quantization error, delta-sigma modulator 100 can include a feedback path for providing a feedback signal 106 (such as an analog feedback signal $X_{FB}$) to the feed forward path. Feedback signal 106 can assist with pushing any quantization error to zero, ensuring that a mean value of output signal 104 is substantially equal to a mean value of input signal 102. In the depicted embodiment, feed forward path can include a summer 110, an integrator 112, an integrator 114, a summer 116, and a quantizer 118; and feedback path can include a digital-to-analog converter (DAC) 120 that converts output signal 104 (digital signal Z) into feedback signal 106 (analog feedback signal $X_{FB}$). In various implementations, summer 110, integrator 112, integrator 114, and summer 116 can form a loop filter, which can be configured for passing a specific frequency range (a band of frequencies) through to quantizer 118, while preventing frequencies outside the specific frequency range from passing through to quantizer 118. As discussed further below, the loop filter is configured to optimize signal-to-noise ratio, for example, by controlling a frequency distribution of quantization noise. In various implementations, the loop filter can shape (move) any quantization noise to higher and/or lower frequencies to achieve a virtually noise-free region in the filtered frequency range. In various implementations, the loop filter is configured as a low pass filter, a band-pass filter, a high-pass filter, or combination thereof.

In operation, summer 110 combines input signal 102 (analog input signal $X_{IN}$) with feedback signal 106 (analog feedback signal $X_{FB}$) to generate a difference (error) signal 122 (such as an analog difference signal $X_{DIFF}$), which represents a difference (or error) between input signal 102 and feedback signal 106. Integrator 112 then integrates difference signal 122 to generate an integrated difference signal 124 (such as an analog integrated difference signal X1), which is further integrated by integrator 114 to generate an integrated difference signal 126 (such as an analog integrated difference signal X2). In the depicted embodiment, integrator 114 has an associated feed forward gain path 128 that generates an integrated gain signal 130 (such as an analog, integrated gain signal Y1) according to a feed forward gain coefficient, GAIN. Summer 116 combines integrated difference signal 126 (analog, integrated difference signal X2) with integrated gain signal 130 (analog, integrated gain signal Y1) to generate an integrated difference signal 132 (such as an analog signal Y) for digitization by quantizer 118, where quantizer 118 converts integrated difference signal 132 (analog signal Y) into output signal 104 (digital signal Z). In various implementations, quantizer 118 can compare a reference voltage with a voltage associated with integrated difference signal 132 (analog signal Y), generating a "high" or a "low" output, such as a digital 1 or a digital 0, based on the comparison.

Figure 3:
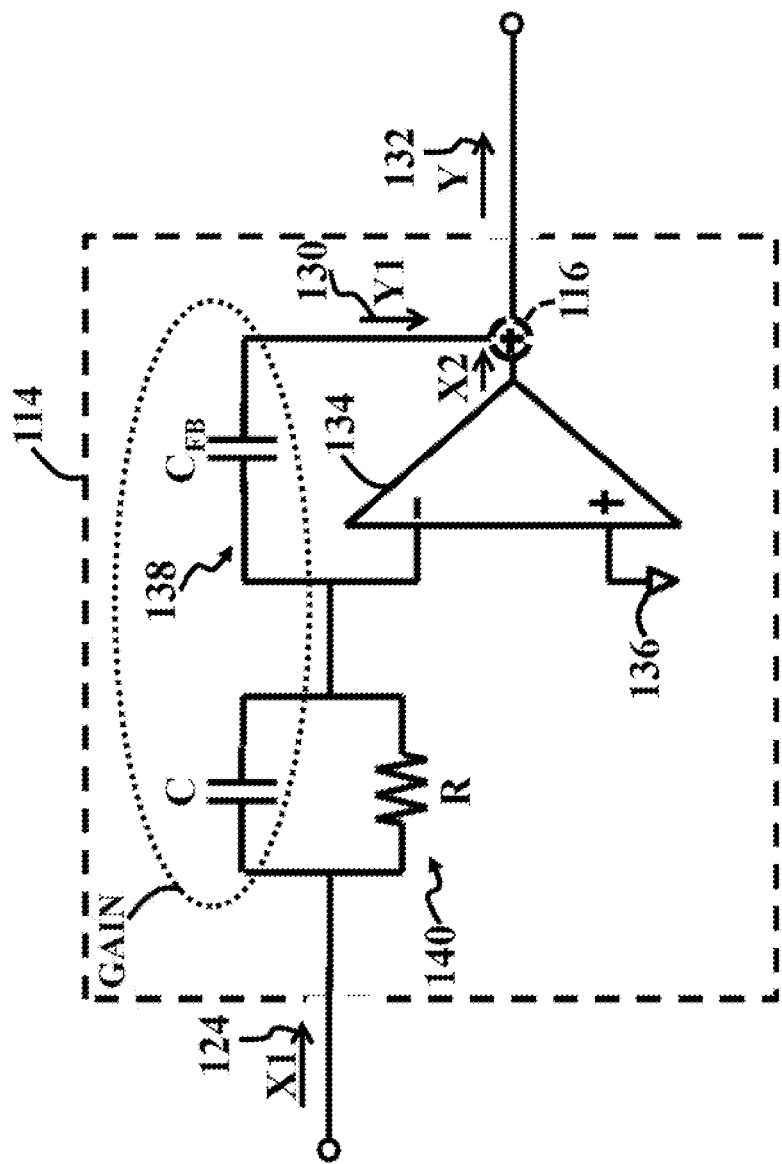
FIG. 3 is a schematic circuit diagram of an exemplary integrator, which can be implemented in delta-sigma modulator depicted in FIG. 2, according to various aspects of the present disclosure.

FIG. 3 is a simplified schematic circuit diagram of an exemplary integrator that can be implemented in a delta-sigma modulator, such as integrator 114 implemented in delta-sigma modulator 100 of FIG. 2, according to various aspects of the present disclosure. In FIG. 3, integrator 114 is configured as an RC integrator. Integrator 114 includes an operational amplifier 134 that includes an inverting input (labeled as "−") and a non-inverting input (labeled as "+"). In various implementations, a ground node 136 is coupled with non-inverting input of operational amplifier 134, and a capacitive feedback 138 is coupled with the inverting input and the output of operational amplifier 134. For example, a feedback capacitor $C_{FB}$ is coupled with inverting input and output of operational amplifier 134. Integrator 114 further includes a resistor/capacitor pair 140, such as a resistor R coupled in parallel with a capacitor C. In various implementations, feed forward gain path 128 can be formed by capacitor C and feedback capacitor $C_{FB}$ to generate integrated gain signal 130 according to feed forward gain coefficient, GAIN. In various implementations, feed forward gain coefficient, GAIN, introduces a gain of about 1.5 to integrated difference signal 124 (analog integrated difference signal X1), thereby generating integrated gain signal 130 (analog, integrated gain signal Y1, noting that Y1=GAIN*X1). Integrator 114 provides integrated difference signal 126 (analog integrated difference signal X2) and integrated gain signal 130 (analog, integrated gain signal Y1) to summer 116, which generates integrated difference signal 132 (analog signal Y) for digitization. FIG. 3 has been simplified for the sake of clarity to better understand the inventive concepts of the present disclosure. Additional features can be added in integrator 114, and some of the features described can be replaced or eliminated in other embodiments of integrator 114.

Returning to FIG. 2, as noted above, the loop filter of delta sigma modulator 100 (here, summer 110, integrator 112, integrator 114, and summer 116) optimizes signal-to-noise ratio (SNR) by controlling (shaping) a frequency distribution of quantization noise, which can be modeled by a noise transfer function (NTF). For example, the loop filter can shape a noise transfer function associated with delta-sigma modulator 100 to shift quantization noise to higher frequencies, where a notch frequency sets a frequency (or range of frequencies) that will be rejected by the loop filter. In various implementations, the notch frequency defines a location of NTF zeros (filter poles), which identifies a band of frequencies from which the quantization noise is filtered away from. Generally, for second-order low passband delta-sigma modulators, placing NTF zero at 0.57 of a frequency bandwidth of interest will maximize SNR. However, for intermediate frequency (IF) signals, NTF zeros are optimally placed at the intermediate frequency to maximize SNR. For example, when implemented in radio frequency (RF) applications, delta-sigma modulator 100 receives radio frequency (RF) signals (also referred to as IF signals). In such applications, delta-sigma modulator 100 can be configured to adjust the notch frequency, locating NTF zeros at an intermediate frequency associated with input signal 102. For example, the loop filter can include a feedback path 150 that forms an internal loop from a node 152 coupled with an output of integrator 114 (which receives integrated difference signal 126 (analog integrated difference signal X2)) to summer 110, which can combine input signal 102 (analog, input signal $X_{IN}$), feedback signal 106 (analog, feedback signal $X_{FB}$), and integrated difference signal 126 (analog integrated difference signal X2). Feedback path 150 has an associated feedback coefficient −g that controls a location of NTF zero in the noise transfer function, thereby maximizing SNR. For example, feedback coefficient −g creates a notch in the loop filter, which can be adjusted (programmed) to optimal locations to accommodate a changing frequency of input signal 102. In various implementations, delta-sigma modulator 100 can move NTF zero to a non-DC location by varying feedback coefficient −g, noting that when feedback coefficient −g equals zero, NTF zero is placed at DC. In practical application, node 152 is often inaccessible, such that feedback path 150 is not easily realizable, and thus integrated difference signal 126 (analog integrated difference signal X2) is not readily accessible. The following description proposes various delta-sigma modulator configurations for passively emulating integrated difference signal 126 (analog integrated difference signal X2) by using readily accessible signals, which can thus facilitate adjusting (including tuning and/or programming) a delta-sigma modulator's notch frequency. Though the following delta-sigma modulator configurations are described with reference to placing notch frequencies, the present disclosure contemplates that the delta-sigma modulator configurations and associated techniques described herein can be implemented in delta-sigma modulators to dynamically tune loop filter coefficients for various applications, without limitation to placing notch frequencies.

Figure 4:
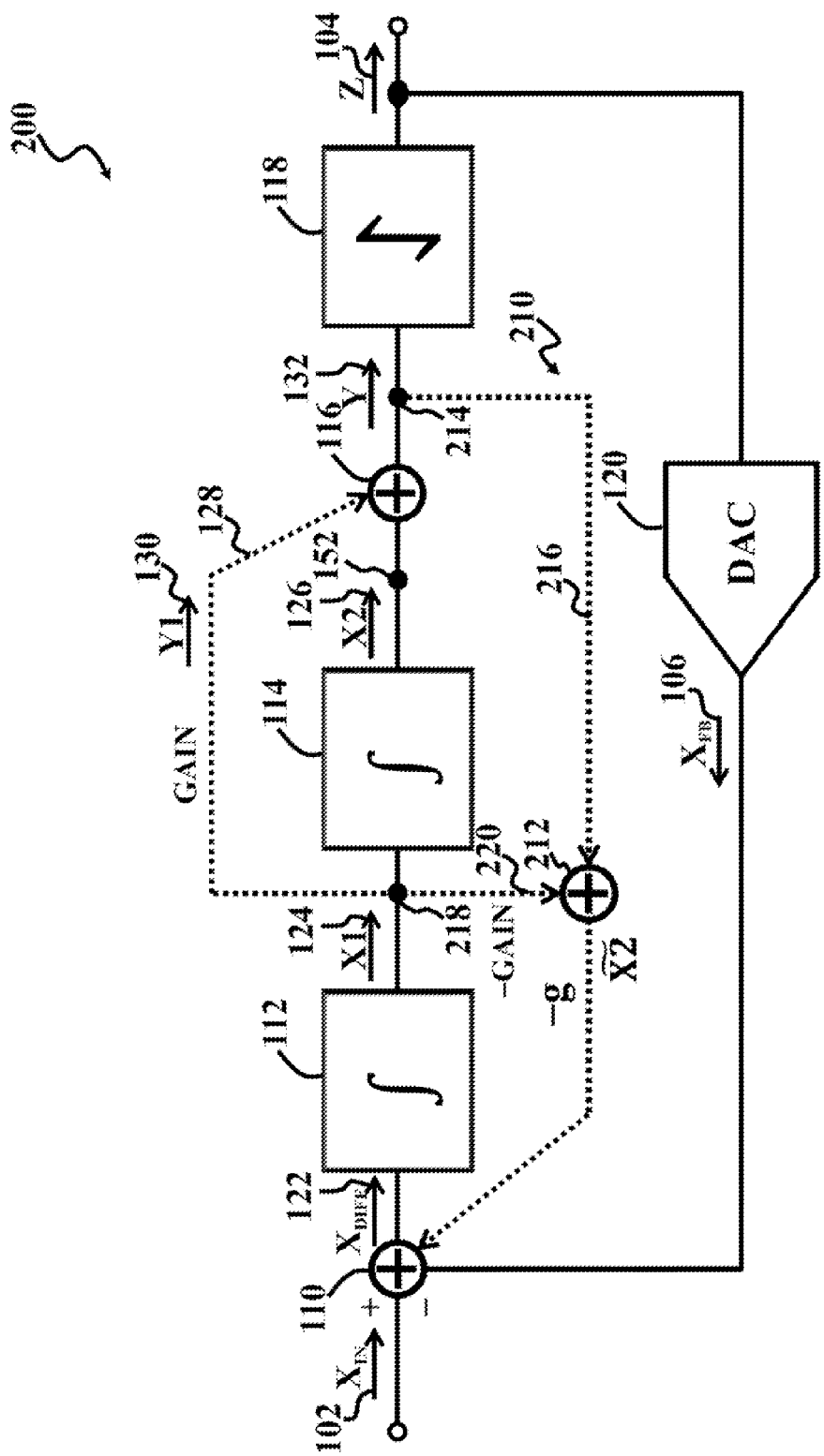
FIG. 4 is a schematic circuit diagram of another exemplary delta-sigma modulator according to various aspects of the present disclosure.

FIG. 4 is a simplified schematic circuit diagram of another exemplary delta-sigma modulator 200 according to various aspects of the present disclosure. Delta-sigma modulator 200 is an electronic device (including an electronic circuit and/or one or more components) configured to convert input signal 102 (analog signal $X_{IN}$) into output signal 104 (digital signal Z). In various implementations, delta-sigma modulator 200 is a continuous time delta-sigma modulator. The embodiment of FIG. 4 is similar in many respects to the embodiment of FIG. 2. Accordingly, similar features in FIG. 2 and FIG. 4 are identified by the same reference numerals for clarity and simplicity. FIG. 4 has been simplified for the sake of clarity to better understand the inventive concepts of the present disclosure. Additional features can be added in delta-sigma modulator 200, and some of the features described below can be replaced or eliminated in other embodiments of delta-sigma modulator 200.

In FIG. 4, to adjust a notch frequency, the loop filter can include a feedback path 210 that has associated feedback coefficient −g for controlling a location of NTF zero in the noise transfer function, thereby maximizing SNR of delta-sigma modulator 200. In contrast to feedback path 150 of delta-sigma modulator 100, feedback path 200 emulates integrated difference signal 126 (analog integrated difference signal X2) using accessible signals. For example, recognizing that integrated difference signal 132 (analog signal Y) results from combining integrated difference signal 126 (analog, integrated signal X2) and integrated gain signal 130 (analog, integrated gain signal Y1), integrated difference signal 132 (analog signal Y) can be represented as:

$$Y = X2 + Y1 = X2 + (GAIN*X1)$$

And, when rewritten, integrated difference signal 126 (analog, integrated signal X2) can be represented as:

$$X2 = Y - Y1 = Y - (GAIN*X1)$$

Feedback path 210 can include a summer 212 coupled with a node 214 to form feedback portion 216 and a node 218 to form a feedback portion 220, where feedback portion 216 is configured to provide integrated difference signal 132 (analog signal Y) to summer 212, and feedback portion 220 is configured to provide a signal representative of integrated gain signal 130 (analog, integrated gain signal Y1). In the depicted embodiment, feedback portion 220 can adjust integrated difference signal 124 (analog integrated difference signal X1) according to a negative feedback gain coefficient, −GAIN, to provide a signal representative of integrated gain signal 130 (analog, integrated gain signal Y1). In operation, summer 212 can combine adjusted, integrated difference signal 124 (analog integrated difference signal X1) and integrated difference signal 132 (analog signal Y) to generate a signal that represents integrated difference signal 126 (analog integrated difference signal X2), thereby providing feedback coefficient −g for tuning a loop filter coefficients, and in the depicted embodiment, for creating a notch in the loop filter. Similar to delta-sigma modulator 100 of FIG. 2, delta-sigma modulator 200 of FIG. 4 can adjust (program) a loop filter coefficient to optimize operation. For example, delta-sigma modulator 200 can adjust (program) a notch frequency to optimal locations to accommodate a changing frequency of input signal 102. In various implementations, delta-sigma modulator 200 can move NTF zero to a non-DC location by varying (tuning) feedback coefficient −g.

Figure 5:
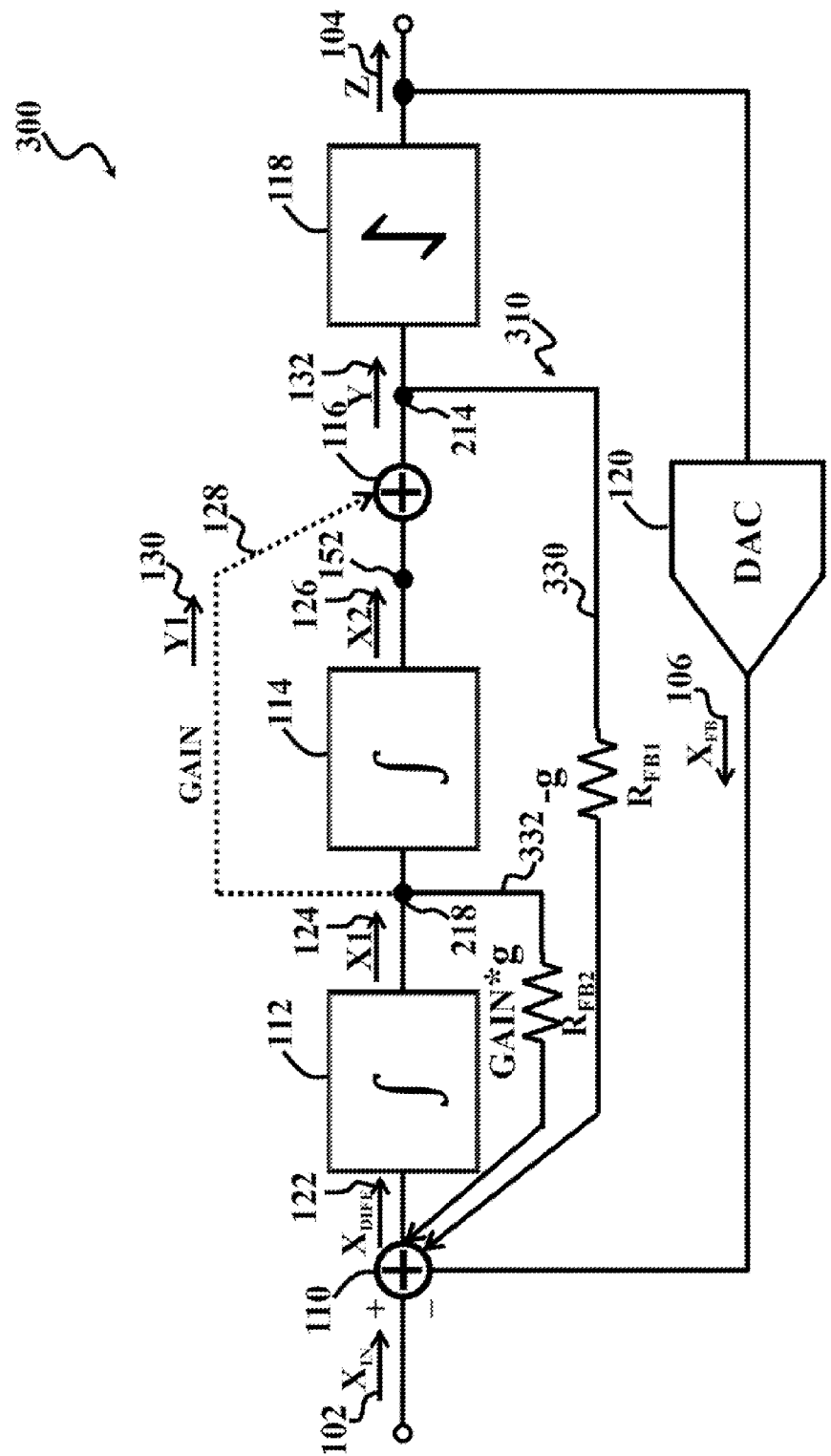
FIG. 5 is a schematic circuit diagram of yet another exemplary delta-sigma modulator according to various aspects of the present disclosure.

FIG. 5 is a simplified schematic circuit diagram of an exemplary delta-sigma modulator 300, which can implement loop filter coefficient tuning principles (for example, to achieve notch frequency placement) described in FIG. 4, according to various aspects of the present disclosure. For example, delta-sigma modulator 300 can tune loop filter coefficients to set a notch frequency of a noise transfer function based on a frequency of an incoming signal, such as input signal 102. Similar to delta-sigma modulator 200, delta-sigma modulator 300 is an electronic device (including an electronic circuit and/or one or more components) configured to convert input signal 102 (analog signal $X_{IN}$) into output signal 104 (digital signal Z). In various implementations, delta-sigma modulator 300 is a continuous time delta-sigma modulator. The embodiment of FIG. 5 is similar in many respects to the embodiment of FIG. 4. Accordingly, similar features in FIG. 4 and FIG. 5 are identified by the same reference numerals for clarity and simplicity. FIG. 5 has been simplified for the sake of clarity to better understand the inventive concepts of the present disclosure. Additional features can be added in delta-sigma modulator 300, and some of the features described below can be replaced or eliminated in other embodiments of delta-sigma modulator 300.

In FIG. 5, to adjust a loop filter coefficient (in various implementations, to adjust a notch frequency), a feedback path 310 can be placed in the loop filter, where feedback path 310 has an associated feedback coefficient −g for controlling a location of NTF zero in the noise transfer function of delta-sigma modulator 300, such that delta-sigma modulator 300 can maximize SNR for various frequencies. Feedback path 310 is configured to emulate integrated difference signal 126 (analog integrated difference signal X2), which is represented by feedback coefficient −g, using accessible signals. In the depicted embodiment, feedback path 310 includes a passive feedback resistor network. For example, feedback path 310 has a feedback resistor portion 330 that includes a feedback resistor $R_{FB1}$ and a feedback resistor portion 332 that includes a feedback resistor $R_{FB2}$. Feedback resistor $R_{FB1}$ is coupled with node 214 and summer 110, and feedback resistor $R_{FB2}$ is coupled with node 218 and summer 110. In various implementations, in feedback resistor portion 330, feedback resistor $R_{FB1}$ generates feedback coefficient −g based on integrated difference signal 132 (analog signal Y), and feedback resistor portion 332 generates feedback coefficient g according to the feed forward gain coefficient, GAIN, based on integrated difference signal 124 (analog integrated difference signal X1). Summer 110 receives feedback coefficient −g from feedback resistor portion 330 and feedback coefficient g adjusted by feed forward gain coefficient GAIN from feedback resistor portion 320, which are used to generate difference signal 122 (analog difference signal $X_{FB}$). The passive feedback resistor network of feedback path 310 essentially creates a resonator, which can be used to set loop filter coefficients, in some embodiments, to place notches in the loop filter.

The passive feedback resistor network can be easily implemented with minimal modification to existing delta-sigma modulator architectures, providing a low power, low risk solution to programming NTF zeros. However, as noted above, in various implementations, delta-sigma modulator 300 is desirably configured to continuously adjust loop filter coefficients. For example, desirably, delta-sigma modulator can continuously adjust notch frequencies to match an IF frequency of input signal 102 (which is often continually adjusted by an associated system), and to achieve maximum SNR, delta-sigma modulator 300 needs to accurately place NTF zeros at the IF frequency. Since a frequency associated with NTF zero is proportional to a square root of a resistor's value, to cover a sufficient frequency range, resistor values of the passive feedback resistor network can be configured adjustable over more than one decade range, ideally with good accuracy. Such configurations can present difficulties. For example, in the depicted embodiment, adjusting (tuning) both feedback resistor $R_{FB1}$ and feedback resistor $R_{FB2}$ simultaneously while maintaining a gain ratio consistent with the feed forward gain coefficient can be quite complicated. In implementations where delta-sigma modulator 300 uses a resistor array to cover an adjustable range greater than one decade, each resistor of the resistor array will be tuned to cover a particular range, further complicating programmability and design. Further difficulties arise when trying to program resistor values with good resolution. For example, generally, a resistor value is programmed using a switch to short some switches of the resistor array, where a switch on-resistance associated with the switch will affect tuning accuracy. To achieve small tuning steps while reducing switch on-resistance, a relatively large switch will be implemented, which can lead to increased area, increased complexity, and/or increased parasitic capacitance. Furthermore, a bulky resistor for achieving wider adjustable ranges can significantly reduce bandwidth, resulting from a relatively large time constant related to a relatively large parasitic capacitance and a relatively large resistor. When implemented in ADCs, such configurations can immensely increase complexity.

Figure 6:
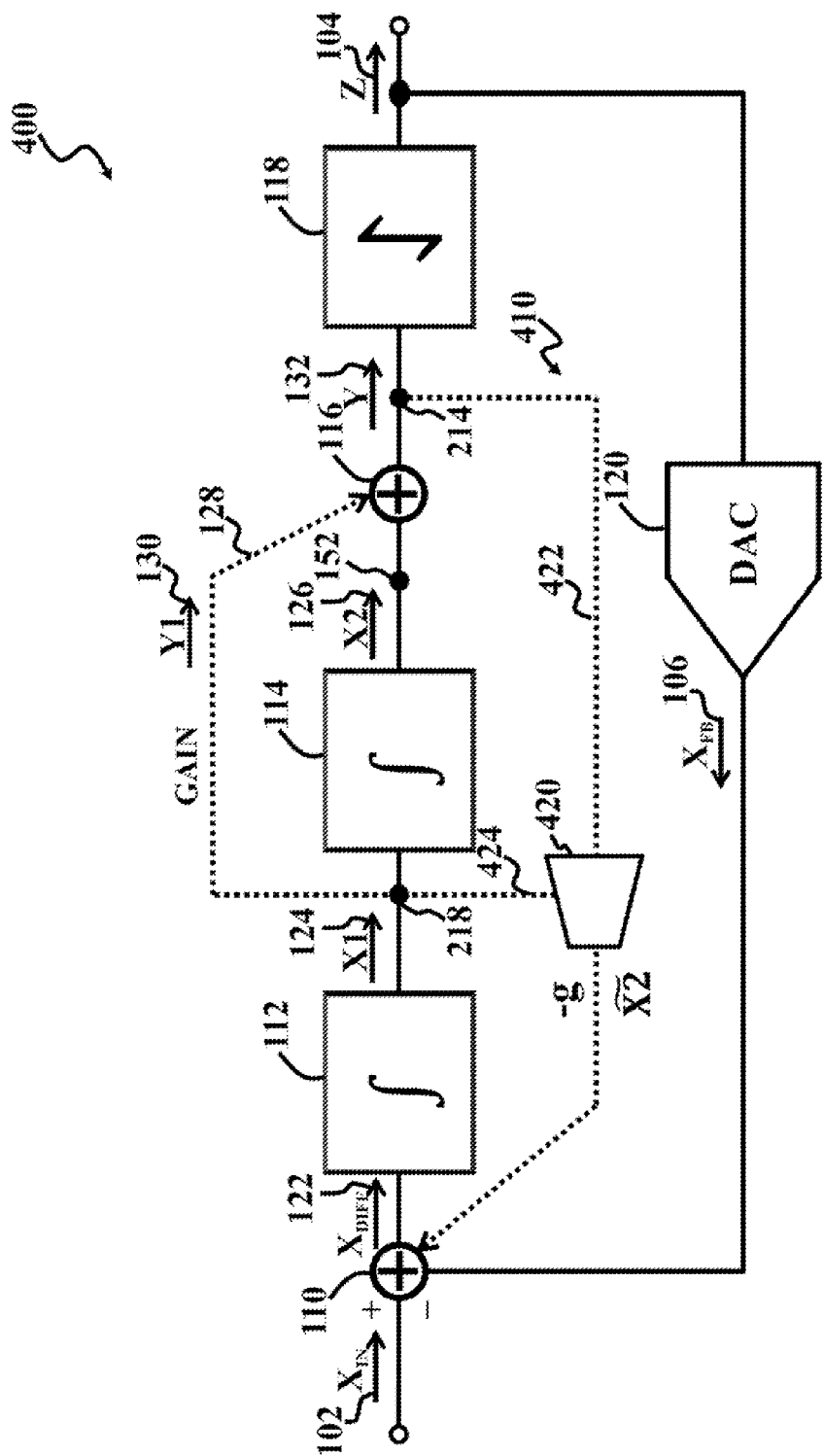
FIG. 6 is a schematic circuit diagram of yet another exemplary delta-sigma modulator according to various aspects of the present disclosure.

To address such difficulties, the present disclosure proposes a delta-sigma modulator that includes a transconductor network for dynamically tuning its associated loop filter coefficient(s). In various implementations, the delta-sigma modulator can place notch frequencies of the noise transfer function at desired frequencies, such as an intermediate frequency of an input signal. FIG. 6 is a simplified schematic circuit diagram of another exemplary delta-sigma modulator 400, which can implement loop filter coefficient tuning principles (for example, to achieve notch frequency placement) described in FIG. 4, according to various aspects of the present disclosure. For example, delta-sigma modulator 400 can tune loop filter coefficients to set a notch frequency of a noise transfer function based on a frequency of an incoming signal, such as input signal 102. Similar to delta-sigma modulator 200, delta-sigma modulator 400 is an electronic device (including an electronic circuit and/or one or more components) configured to convert input signal 102 (analog signal $X_{IN}$) into output signal 104 (digital signal Z). In various implementations, delta-sigma modulator 400 is a continuous time delta-sigma modulator. The embodiment of FIG. 6 is similar in many respects to the embodiment of FIG. 4. Accordingly, similar features in FIG. 4 and FIG. 6 are identified by the same reference numerals for clarity and simplicity. FIG. 6 has been simplified for the sake of clarity to better understand the inventive concepts of the present disclosure. Additional features can be added in delta-sigma modulator 400, and some of the features described below can be replaced or eliminated in other embodiments of delta-sigma modulator 400.

In FIG. 6, to adjust a loop filter coefficient (in various implementations, to adjust a notch frequency), a feedback path 410 can be placed in the loop filter, where feedback path 410 has an associated feedback coefficient −g for controlling a location of NTF zero in the noise transfer function of delta-sigma modulator 400, such that delta-sigma modulator 400 can maximize SNR for various frequencies. Feedback path 410 is configured to emulate integrated difference signal 126 (analog integrated difference signal X2), which is represented by feedback coefficient −g, using accessible signals. For example, feedback path 410 includes a transconductor network 420 configured to generate feedback coefficient −g for placing notch frequencies in the noise transfer function of the loop filter. As described further below, by adjusting an equivalent transconductance (Gm) associated with transconductor network 420, delta-sigma modulator 400 can dynamically tune loop filter coefficient(s) of delta-sigma modulator 400, such that delta-sigma modulator 400 can optimally place notch frequencies in the noise transfer function. In the depicted embodiment, transconductor network 420 is coupled with an output of summer 116 via node 214 to form feedback portion 422 and an output of integrator 112 via node 218 to form feedback portion 424. Transconductor network 420 generates feedback coefficient −g from integrated difference signal 132 (analog signal Y) received from feedback portion 422 and integrated difference signal 124 (analog integrated difference signal X1) received from feedback portion 424. In various implementations, transconductor network 420 can generate feedback coefficient −g from a linear combination of integrated difference signal 132 (analog signal Y) and integrated difference signal 124 (analog integrated difference signal X1).

Figure 7:
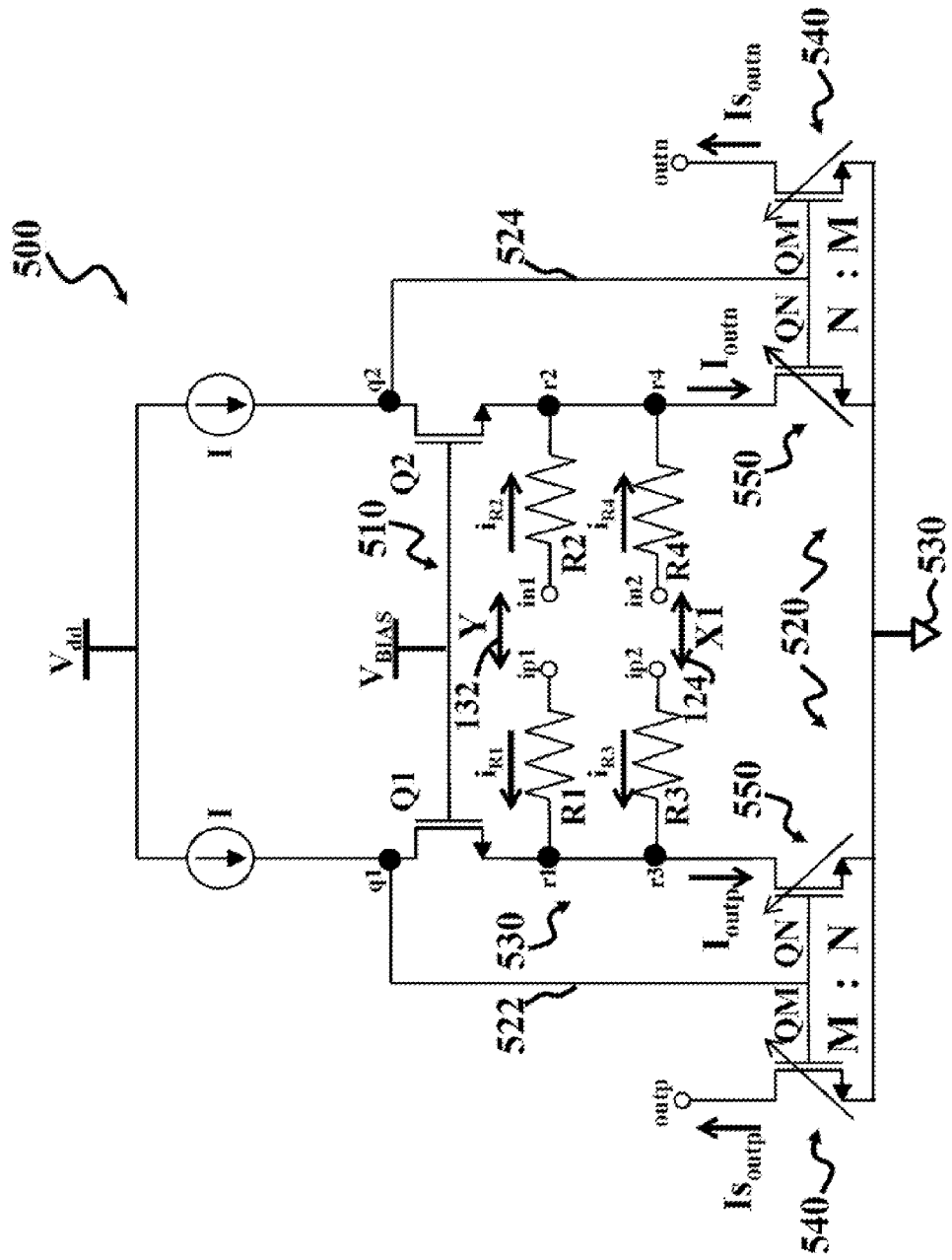
FIG. 7 is a schematic circuit diagram of an exemplary transconductor network that can be implemented in a delta-sigma modulator, such as delta-sigma modulator depicted in FIG. 6, according to various aspects of the present disclosure.

FIG. 7 is a simplified schematic circuit diagram of an exemplary transconductor network 500 that can be implemented in a delta-sigma modulator, such as delta-sigma modulator 400 of FIG. 6, according to various aspects of the present disclosure. In the depicted embodiment, transconductor network 500 is a multi-in, single-out continuously adjustable transconductance network. For example, transconductor network 500 is coupled with an output of summer 116 for receiving integrated difference signal 132 (analog signal Y) and an output of integrator 112 for receiving integrated difference signal 124 (analog integrated difference signal X1). In the depicted embodiment, transconductor network 500 has two inputs: a differential input (for example, input in2 and input ip1) for receiving integrated difference signal 132 and a differential input (for example, input in2 and input ip2) for receiving integrated difference signal 124. Transconductor network 500 further includes a single output for providing feedback coefficient −g. In the depicted embodiment, transconductor network 500 has a differential output (for example, output outn and output outp) for providing feedback coefficient −g, which emulates integrated difference signal 126 (analog integrated difference signal X2). Though the depicted embodiment depicts a multi-in, single-out transconductance network, the present disclosure further contemplates implementations where transconductor network 500 includes multiple outputs, such that transconductor network 500 can generate multiple feedback coefficients (loop filter coefficients) that can be fed into a loop filter of a delta-sigma modulator. FIG. 7 has been simplified for the sake of clarity to better understand the inventive concepts of the present disclosure. Additional features can be added in transconductor network 500, and some of the features described can be replaced or eliminated in other embodiments of transconductor network 500.

In FIG. 7, transconductor network 500 includes two stages: a voltage-to-current converter stage 510 and a current scaling stage 520. A pair of transistors, transistor Q1 and transistor Q2, is coupled with voltage-to-current converter stage 510 and current scaling stage 520. Transistor Q1 includes a gate coupled with a biasing voltage source $V_{BIAS}$, a drain coupled with a current source I, and a source coupled with a node r1 of voltage-to-current converter stage 510. Transistor Q2 includes a gate coupled with biasing voltage source $V_{BIAS}$, a drain coupled with current source I, and a source coupled with a node r2 of voltage-to-current converter stage 510. In various implementations, transistor Q1 and transistor Q2 have a floating voltage at respective drains, where the voltage depends on a current input to voltage-to-current converter stage 510. To maintain low impedance at a junction of voltage-to-converter stage 510 and current scaling stage 520, transconductor network 500 has a feedback path 522 and a feedback path 524 from current scaling stage 520 to voltage-to-converter stage 510, where feedback path 522 couples current scaling stage 520 with voltage-to-converter stage 510 via a node q1 coupled with the drain of transistor Q1, and feedback path 524 couples current scaling stage 520 with voltage-to-current converter stage 510 via a node q2 coupled with the drain of transistor Q2.

Voltage-to-current converter stage 510 sets a current ratio for input signals received by transconductor network 500. For example, voltage-to-current converter stage 510 is coupled with an output of summer 116 and an output of integrator 112, such that voltage-to-current converter stage 510 receives integrated difference signal 132 (analog signal Y) and integrated difference signal 124 (analog integrated difference signal X1) and sets a ratio between integrated difference signal 132 and integrated difference signal 124. In the depicted embodiment, voltage-to-current converter stage 510 includes a resistor array 530, which receives integrated difference signal 132 (analog signal Y) from summer 116 via differential input, input in1 and input ip1, and integrated difference signal 124 from integrator 112 via differential input, input in2 and input ip2. Resistor array 530 generates a current signal that represents a current ratio of integrated difference signal 132 and integrated difference signal 124, such as a current signal $I_{outp}$ and a current signal $I_{outn}$. In the depicted embodiment, resistor array 530 includes a resistor R1 that converts integrated difference signal 132 into a current signal $i_{R1}$, a resistor R2 that converts integrated difference signal 132 into a current signal $i_{R2}$, a resistor R3 that converts integrated difference signal 124 into a current signal $I_{R3}$, and a resistor R4 that converts integrated difference signal 124 into a current signal $i_{R4}$. Accordingly, current signal $I_{outp}$ represents current signal $i_{R1}$ combined with current signal $i_{R3}$ according to a current ratio set by resistor R1 and resistor R3, and current signal $I_{outn}$ represents current signal $i_{R2}$ combined with current signal $i_{R4}$ according to a current ratio set by resistor R2 and resistor R4. In furtherance of the depicted embodiment, resistor R1, resistor R2, resistor R3, and resistor R4 have fixed values, such that resistor array 530 has a fixed equivalent resistance ($R_{notch}$) and a fixed current ratio between input signals (here, integrated difference signal 132 and integrated difference signal 124). Any resistor value is contemplated for resistor R1, resistor R2, resistor R3, and resistor R4 depending on design considerations of transconductor network 500 and its associated delta-sigma modulator. In various implementations, resistor R1 and resistor R2 have a same value, and resistor R3 and resistor R4 have a same value. In various implementations, resistor R1 and resistor R2 have a different value than resistor R3 and resistor R4.

Current scaling stage 520 scales a current signal received from voltage-to-current converter stage 510 according to a scaling factor, k, where the scaled current signal emulates integrated difference signal 126. The scaled current signal provides feedback coefficient −g to the loop filter of delta-sigma modulator 400, particularly summer 110. In the depicted embodiment, current scaling stage 520 adjusts current signal $I_{outp}$ to provide a scaled current signal $IS_{outp}$ and current signal $I_{outn}$ to provide a scaled current signal $IS_{outn}$. Since the input signals received by current scaling stage 520 will vary based on a frequency of input signal 102, scaling factor k can be adjusted to vary scaled current signal $IS_{outp}$ and scaled current signal $IS_{outn}$ to achieve a desired loop filter coefficient. For example, in various implementations, scaling factor k can be adjusted to vary scaled current signal $IS_{outp}$ and scaled current signal $IS_{outn}$ to achieve a desired feedback coefficient −g for placing a notch frequency in the noise transfer function of delta-sigma modulator 400 that is at about the frequency of input signal 102. Scaling factor k can be continuously adjusted as the frequency of input signal 102 changes, such that NTF zeros are continuously, optimally placed during operation.

Current scaling stage 520 includes a coarse tune mechanism 540 having an associated number of coarse tune steps M and a fine tune mechanism 550 having an associated number of fine tune steps N, where scaling factor k can be represented by:

$$k = \frac{M}{N}$$

In operation, in the depicted embodiment, coarse tune step M sets a current scaling ratio for current signal $I_{outp}$ and current signal $I_{outn}$, while fine tune step N optimizes scaling factor k to achieve a particular notch frequency placement. Fine tune step N is set independent of the current scaling ratio defined by coarse tune step M. In various implementations, digital control bits set coarse tune step M and fine tune step N. In FIG. 5, an equivalent transconductance (Gm) of transconductor network 500 is varied by setting scaling factor k, which sets feedback coefficient −g to achieve desired loop filter coefficients, which can be used to place notch frequencies. For example, equivalent transconductance of transconductor network 500 can be represented by:

$$G_m = \frac{k}{R_{notch}} = \frac{M/N}{R_{notch}}$$

Since, as noted above, equivalent resistance $R_{notch}$ of resistor array 530 is fixed, varying scaling factor k varies equivalent transconductance, which essentially varies the equivalent resistance $R_{notch}$ over a large range without requiring adjustment of resistor values of resistor array 530. Delta-sigma modulator 400 can thus dynamically tune loop filter coefficients over a large range, and in various implementations, place notch frequencies over a large range of frequencies, by implementing transconductor network 500. In various implementations, where input signal 102 has a frequency that ranges from about 50 KHz to about 200 KHz, delta-sigma modulator 400 will need to achieve equivalent resistances in the feedback path 410 ranging from about 0.34 MOhm to about 3.7 MOhm to generate desired feedback coefficients −g for placing notch frequencies at such frequencies. In various implementations, by varying scaling factor k, transconductor network 500 can achieve such equivalent resistances, for example, ranging from about 0.2 MOhm to about 5 MOhm.

Figure 8B:
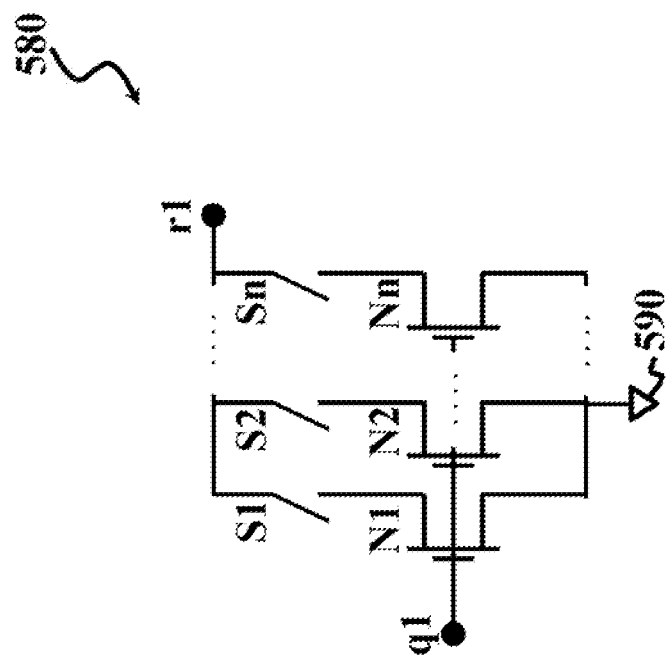
FIG. 8A and FIG. 8B are schematic circuit diagrams of exemplary transistor arrays that can be implemented in a transconductor network, such as transconductor network depicted in FIG. 7, according to various aspects of the present disclosure.
Figure 8A:
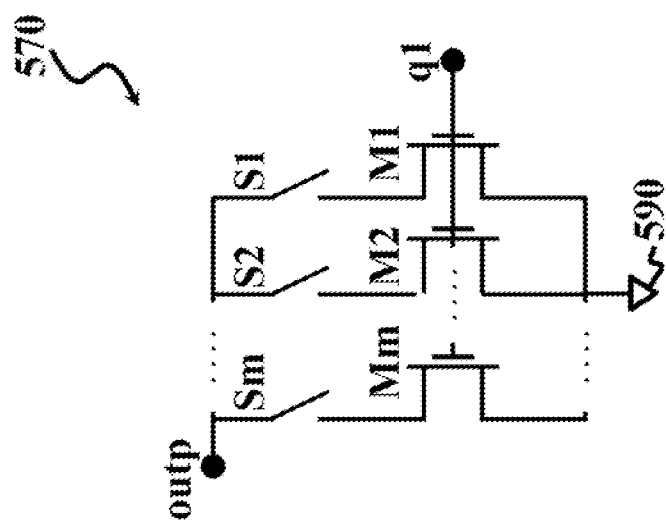

Coarse tune mechanism 540 can include a switching network, such as a transistor array QM for varying coarse tune step M to achieve a desired current scaling ratio; and fine tune mechanism 550 can include a switching network, such as a transistor array QN for varying fine tune step N to optimize the current scaling ratio. FIG. 8A and FIG. 8B are simplified schematic circuit diagrams of an exemplary transistor array 570 and an exemplary transistor array 580 that can be implemented in a transconductor network, such as transconductor network 500 of FIG. 6, according to various aspects of the present disclosure. In various implementations, transistor array 570 can be implemented as transistor array QM in coarse tune mechanism 540, and transistor array 580 can be implemented as transistor array QN in fine tune mechanism 550. In FIG. 8A, transistor array 570 includes transistors M1, M2, . . . , Mm, where m is a total number of transistors in transistor array 570. Each transistor M1, M2, . . . , Mm has a drain coupled with an associated switch S1, S2, . . . , Sm, such that transistors can be selectively switched in and/or out of transistor array 570 to vary a gain at the output, such as outp, of transconductor 500. In various implementations, digital control bits can selectively switch transistors in or out of transistor array 570 to set coarse tune step M. Further, a source of each transistor M1, M2, . . . , Mm is coupled with a ground node 590, and a gate of each transistor M1, M2, . . . , Mm is coupled with node q1, such that transistors in transistor array 570 are tied to the drain of transistor Q1. In FIG. 8B, transistor array 580 includes transistors N1, N2, . . . , Nn, where n is a total number of transistors in transistor array 580. Each transistor N1, N2, . . . , Nn has a drain coupled with voltage-to-current stage 510 at node r1 via an associated switch S1, S2, . . . , Sn, such that transistors can be selectively switched in and/or out of transistor array 580 to vary a gain of an input signal to transconductor 500. In various implementations, digital control bits can selectively switch transistors in or out of transistor array 580 to set fine tune step N. Further, a source of each transistor N1, N2, . . . , Nn is coupled with ground node 590, and a gate of each transistor N1, N2, . . . , Nn is coupled with node q1, such that transistors in transistor array 580 are tied to the drain of transistor Q1. FIG. 8A and FIG. 8B have been simplified for the sake of clarity to better understand the inventive concepts of the present disclosure. Additional features can be added in transistor array 570 and transistor array 580, and some of the features described can be replaced or eliminated in other embodiments of transistor array 570 and transistor array 580.

Returning to FIG. 7, each coarse tune step M can represent a gain applied to current signal $I_{outp}$ and current signal $I_{outn}$. In various implementations, transistor array QM includes a transistor associated with each coarse tune step M, where each transistor is controlled by a coarse tune bit. In some implementations, coarse tune mechanism 540 may include sixty-three coarse tune steps (M=1 to 63), where transistor array QM has sixty-three transistors, each transistor responsive to a coarse tune bit. Depending on a state of a transistor's coarse tune bit, a gain associated with the transistor may or may not be applied to current signal $I_{outp}$ and current signal $I_{outn}$. Similarly, transistors can be selectively switched in and/or out of transistor array QN associated with fine tune mechanism 550 to vary the gain at the output of transconductor 500. In various implementations, fine tune step N is represented by:

$$N = N_{FIXED} + \Delta N$$

where $N_{FIXED}$ is a number of fine tune steps provided by fine tune mechanism 550 and $\Delta N$ is a change in the number of fine tune steps to achieve a desired gain. Adjusting fine tune step N based on $\Delta N$ (in essence, a percentage) ensures that fine tune step N is not dependent on the current scaling ratio set by coarse tune step M. In various implementations, transistor array QN can also include a transistor associated with each fine tune step, where each transistor is controlled by a fine tune bit. For example, in some implementations, fine tune mechanism 550 may include forty-eight fine tune steps ($N_{FIXED}$=48), where transistor array QN has forty-eight transistors responsive to a fine tune bit. Depending on a state of a transistor's fine tune bit, a gain associated with the transistor may or may not be applied to current signal $I_{outp}$ and current signal $I_{outn}$. In some implementations, each fine tune step may provide a gain of about 1.5, where $\Delta N$ can range from about −9 to about 13.5.

In operation, coarse tune step M can set a resistance sub-range (for example, a desired resistance range that includes a particular resistance for achieving a desired loop filter coefficient, such as loop filter coefficients for achieving a desired notch frequency placement), and fine tune step N can set a particular resistance within the resistance sub-range (for example, the particular resistance for achieving the desired loop filter coefficient, such as that for achieving the desired notch frequency placement). Fine tune step N can also calibrate out any mismatch error from transistor array QM, which may arise from manufacturing imperfections. For example, where transconductor network 500 can achieve resistances that range from about 0.2 MOhm to about 5 MOhm, coarse tune step M may be set to achieve a resistance sub-range that includes resistances ranging from about 280 kOhm to about 320 kOhm, and fine tune step N can then be set to achieve a particular resistance within the resistance sub-range, for example, 300 kOhm. In various implementations, fine tuning can achieve a desired resistance for achieving desired notch frequency placement within about 1%. By combining coarse tuning mechanism 540 and fine tuning mechanism 550, transconductor network 500 can precisely place loop filter coefficients, and in the described embodiment precisely place notch frequencies (NTF zeros), with about a 1% or less accuracy over a large frequency range. Consequently, delta-sigma modulator 400 can maximize SNR across a large frequency range, particularly beneficial as the input signal 102 often exhibits a varying frequency over a large frequency range. It is noted that a control unit (mechanism) can be coupled with transconductor network 500 and/or delta-sigma modulator 400 to set coarse tune step and fine tune step for achieving desired loop filter coefficients. In various implementations, digital control bits can set the coarse tune step and the fine tune step to achieve desired scaling ratios for tuning the transconductance.

Turning again to FIG. 6, in operation, transconductor network 500 sets feedback coefficient −g to set a loop filter coefficient of the loop filter of delta-sigma modulator 400. In various implementations, transconductor network 500 sets feedback coefficient −g to achieve notch frequency placement. Summer 110 then combines input signal 102 (analog input signal XIN) with feedback coefficient −g and feedback signal 106 (analog feedback signal XFB) to generate difference signal 122 (such as an analog difference signal XDIFF). It is noted that transconductor network 500 can receive multi-inputs and multi-outputs to provide any number of loop filter coefficients. For example, in various implementations, another input resistor can be included in voltage-to-current converter stage 510 to receive another input signal from the loop filter and generate an output via another coarse/fine tune mechanism of current scaling stage 520. The present disclosure contemplates various multi-input, multi-output scenarios, along with multi-input, single output scenarios that can benefit from transconductor network 500.

Delta-sigma modulator 400 can realize numerous advantages using a transconductor network, such as transconductor network 500, for dynamically tuning loop filter coefficients, and in particular dynamically placing notch frequencies. For example, instead of adjusting a value of a resistor, such as described with reference to delta-sigma modulator 300, delta-sigma modulator 400 can adjust (program) a current ratio to achieve a large range of resistance values for placing notch frequencies. Adjustable current ratio mechanisms can be implemented much easier than adjustable resistor mechanisms, which often need relatively large switches and/or numbers of resistors to achieve resistance values necessary to place desired notch frequencies. Transconductor network 500 can be implemented using much smaller resistors, providing higher, improved bandwidth. And, since transconductor network 500 implements a resistor array having a fixed value, delta-sigma modulator 400 does not have to program multiple resistors simultaneously, which can present difficulties. Furthermore, transconductor network 500 provides high output impedance, which can reduce loading to the loop filter. For example, when connected with the loop filter, transconductor network 500 does not resistively load an amplifier associated with the loop filter, providing a high feedback factor, and thereby relaxing amplifier requirements. Also, transconductor network 500 facilitates single direction signal flow for minimizing or preventing signal feed through, as opposed to that which arises from bi-directional signal flow arising from the passive feedback resistor network of delta-sigma modulator 300. Different embodiments may have different advantages than described herein, and no advantage described herein is required of any embodiment.

Figure 9:
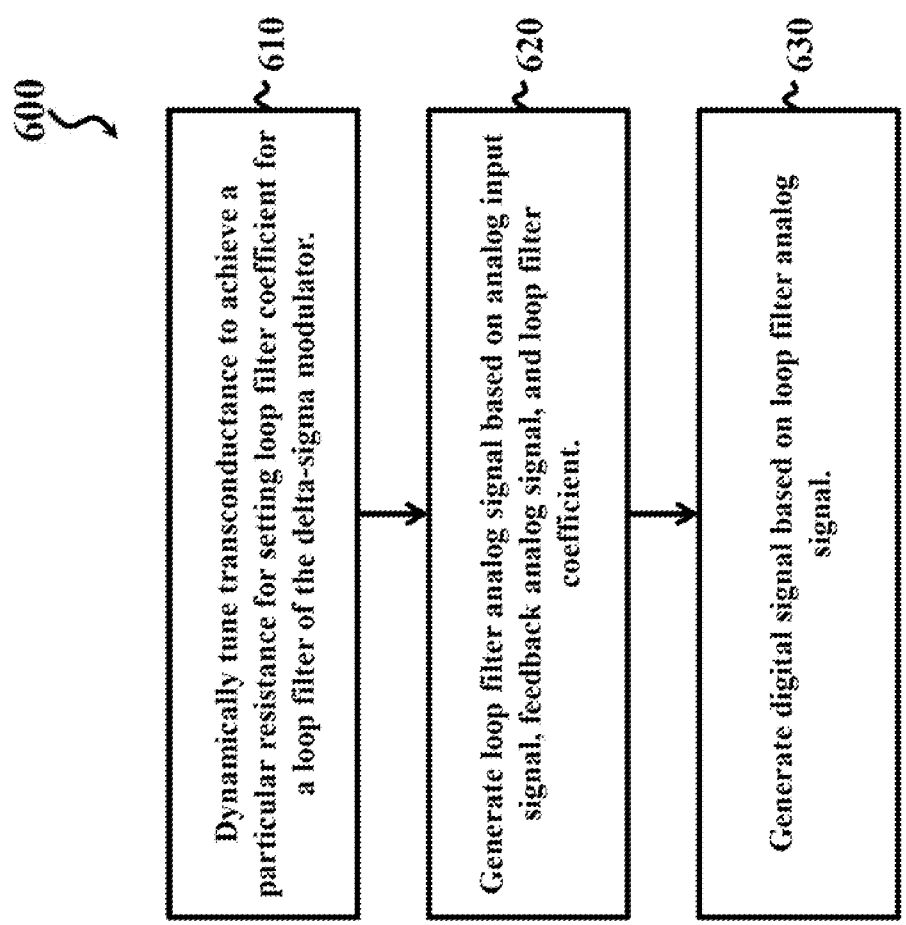
FIG. 9 is a simplified flowchart of exemplary method that can be implemented by a delta-sigma modulator according to various aspects of the present disclosure.

FIG. 9 is a simplified flowchart of an exemplary method 600 that can be implemented by a delta-sigma modulator, such as delta-sigma modulator 400 depicted in FIG. 6, according to various aspects of the present disclosure. At block 610, a transconductance is dynamically tuned to achieve a particular resistance for setting a loop filter coefficient for a loop filter of the delta-sigma modulator. In various implementations, dynamically tuning the transconductance includes generating a current signal based on an input signal received from the loop filter, and scaling the current signal by setting a coarse tune step and a fine tune step of a scaling factor to achieve the particular resistance. The scaling factor is a ratio of the coarse tune step and the fine tune step. In various implementations, the coarse tune step and fine tune step are set by selectively switching transistors in or out of a transistor array. In various implementations, the fine tune step is independent of the coarse tune step. At block 620, a loop filter analog signal is generated based on an analog input signal, a feedback analog signal, and the loop filter coefficient. At block 630, a digital signal is generated based on the loop filter analog signal. FIG. 9 has been simplified for the sake of clarity to better understand the inventive concepts of the present disclosure. Additional steps can be provided before, during, and after method 600 and some of the steps described can be replaced or eliminated for other embodiments of method 600.

In various implementations, data acquisition systems (for example, data acquisition system 10), delta-sigma modulators (for example, delta-sigma modulator 100, delta-sigma modulator 200, delta-sigma modulator 300, and delta-sigma modulator 400), transconductor networks (for example, transconductor network 500), and/or the various circuits and/or components of the FIGURES can be implemented on a board of an associated electronic device. The board can be a general circuit board that can hold various components of an internal electronic system of the electronic device and, further, provide connectors for other peripherals. The board can provide the electrical connections by which the other components of the system can communicate electrically. Any suitable processors (inclusive of digital signal processors, microprocessors, supporting chipsets, etc.), memory elements, etc. can be suitably coupled to the board based on particular configuration needs, processing demands, computer designs, other considerations, or a combination thereof. Other components, such as external storage, sensors, controllers for audio/video display, and peripheral devices may be attached to the board as plug-in cards, via cables, or integrated into the board itself.

In various implementations, data acquisition systems (for example, data acquisition system 10), delta-sigma modulators (for example, delta-sigma modulator 100, delta-sigma modulator 200, delta-sigma modulator 300, and delta-sigma modulator 400), transconductor networks (for example, transconductor network 500), and/or the various circuits and/or components of the FIGURES can be implemented as stand-alone modules (for example, a device with associated components and circuitry configured to perform a specific application or function) or implemented as plug-in modules into application specific hardware of electronic devices. Note that particular embodiments of the present disclosure may be readily included in a system-on-chip (SOC) package, either in part, or in whole. An SOC represents an integrated circuit that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the various functions described herein may be implemented in one or more semiconductor cores (such as silicon cores) in application specific integrated circuits (ASICs), field programmable gate arrays (FPGAs), other semiconductor chips, or combinations thereof.

Note that the activities discussed above with reference to the FIGURES are applicable to any integrated circuits that involve signal processing, particularly those that can execute specialized software programs or algorithms, some of which may be associated with processing digitized real-time data. Certain embodiments can relate to multi-DSP signal processing, floating point processing, signal/control processing, fixed-function processing, microcontroller applications, etc. In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems. Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind). Furthermore, powertrain systems (for example, in hybrid and electric vehicles) can use high-precision data conversion products in battery monitoring, control systems, reporting controls, maintenance activities, etc. In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

The specifications, dimensions, and relationships outlined herein have only been offered for purposes of example and teaching only. Each of these may be varied considerably without departing from the spirit of the present disclosure, or the scope of the appended claims. The specifications apply only to non-limiting examples and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than a restrictive sense. Further the various circuitry configurations described above can be replaced, substituted, or otherwise modified to accommodate various design implementations that achieve the lock detection mechanisms described herein. Moreover, using complementary electronic devices, hardware, software, etc. can offer an equally viable option for implementing the teachings of the present disclosure.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, circuits, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Further, note that references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments. It is further noted that "coupled to" and "coupled with" are used interchangeably herein, and that references to a feature "coupled to" or "coupled with" another feature include any communicative coupling means, electrical coupling means, mechanical coupling means, other coupling means, or a combination thereof that facilitates the feature functionalities and operations, such as the detection mechanisms, described herein.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "steps for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

In various implementations, a system is provided that can be part of any type of computer, which can further include a circuit board coupled to a plurality of electronic components. The system can include means for setting a loop filter coefficient for a loop filter of the delta-sigma modulator; means for generating a loop filter analog signal based on an analog signal, a feedback analog signal, and the loop filter coefficient; and means for generating a digital signal based on the loop filter analog signal. The system can further include means for generating a current signal based on an input signal received from the loop filter, and means for scaling the current signal by setting a coarse tune step and a fine tune step of a scaling factor to achieve the particular resistance, wherein the scaling factor is a ratio of the coarse tune step to the fine tune step. The 'means for' can also or alternatively include (but is not limited to) using any suitable component discussed herein, along with any suitable software, circuitry, hub, computer code, logic, algorithms, hardware, controller, interface, link, bus, communication pathway, etc. In various implementations, the system includes memory that includes instructions that when executed cause the system to perform any of the activities discussed herein. In various implementations, the various functions outlined herein may be implemented by logic encoded in one or more non-transitory and/or tangible media (for example, embedded logic provided in an application specific integrated circuit (ASIC), as digital signal processor (DSP) instructions, software (potentially inclusive of object code and source code) to be executed by a processor, or other similar machine, etc.).

What is claimed is:

1. A transconductor having a dynamically tunable transconductance, the transconductor comprising:
a voltage-to-current converter stage configured to generate a current signal based on a voltage signal; and
a current scaling stage configured to scale the current signal by a scaling factor to achieve a particular transconductance, wherein the current scaling stage includes a coarse tune mechanism having an associated coarse tune step and a fine tune mechanism having an associated fine tune step, wherein the scaling factor is a ratio of the coarse tune step to the fine tune step.

2. The transconductor of claim 1, wherein the voltage-to-current converter stage includes a resistor array having a fixed resistance.

3. The transconductor of claim 1, wherein:
the coarse tune mechanism includes a coarse tune transistor array that includes coarse tune transistors configured for selective switching in or out of the coarse tune transistor array to set the coarse tune step; and
the fine tune mechanism includes a fine tune transistor array that includes fine tune transistors configured for selective switching in or out of the fine tune transistor array to set the fine tune step.

4. The transconductor of claim 1, further including a feedback path from the current scaling stage to the voltage-to-current converter stage, wherein the feedback path is configured to maintain low impedance.

5. The transconductor of claim 4, wherein the feedback path includes a transistor having a source coupled with the voltage-to-current stage and a drain coupled with the current scaling stage.

6. The transconductor of claim 5, wherein the current scaling stage includes:
a coarse tune transistor array having coarse tune transistors, wherein each coarse tune transistor has a drain coupled with an output of the transconductor via a switch, a source coupled with ground, and a gate coupled with the drain of the transistor; and
a fine tune transistor array having fine tune transistors, wherein each fine tune transistor has a drain coupled with the voltage-to-current converter stage via a switch, a source coupled with ground, and a gate coupled with the drain of the transistor.

7. The transconductor of claim 1, further configured to receive at least two input signals, wherein the voltage-to-current converter stage sets a current ratio of the at least two input signals.

8. A delta-sigma modulator comprising:
a loop filter configured to generate a loop filter analog signal based on an analog input signal, a feedback analog signal, and a loop filter coefficient;
a quantizer coupled with the loop filter, wherein the quantizer is configured to generate a digital signal based on the loop filter analog signal;
a transconductor coupled with the loop filter, wherein the transconductor is configured to generate the loop filter coefficient by dynamically tuning a transconductance to achieve a particular resistance, wherein the transconductor includes:
a voltage-to-current converter stage configured to generate a current signal based on a voltage signal received from the loop filter; and
a current scaling stage configured to scale the current signal by a scaling factor to achieve the particular resistance, wherein the current scaling stage includes a coarse tune mechanism having an associated coarse tune step and a fine tune mechanism having an associated fine tune step, wherein the scaling factor is a ratio of the coarse tune step to the fine tune step; and
a digital-to-analog converter coupled with the quantizer and the loop filter, the digital-to-analog converter configured to generate the feedback analog signal based on the digital signal.

9. The delta-sigma modulator of claim 8, wherein the coarse tune step sets a resistance sub-range that includes the particular resistance for setting the loop filter coefficient and the fine tune step sets the particular resistance within the resistance sub-range.

10. The delta-sigma modulator of claim 8, wherein the voltage-to-current converter stage includes a resistor array having a fixed resistance.

11. The delta-sigma modulator of claim 8, wherein the transconductor is configured to generate the loop filter coefficient based on at least two input signals received from the loop filter, wherein the voltage-to-current converter stage sets a current ratio of the at least two input signals.

12. The delta-sigma modulator of claim 8, wherein:
the coarse tune mechanism includes a coarse tune transistor array that includes coarse tune transistors configured for selective switching in or out of the coarse tune transistor array to set the coarse tune step; and
the fine tune mechanism includes a fine tune transistor array that includes fine tune transistors configured for selective switching in or out of the fine tune transistor array to set the fine tune step.

13. The delta-sigma modulator of claim 8, wherein the analog input signal has an associated intermediate frequency (IF), and the transconductor is configured to generate a loop filter coefficient that places a notch frequency in a noise transfer function at about the IF frequency.

14. The delta-sigma modulator of claim 8, wherein the transconductor forms a feedback path configured to emulate an integrated difference signal generated by an nth integrator of the loop filter.

15. The delta-sigma modulator of claim 8, wherein the loop filter includes:
a first summer configured to generate a difference signal based on the analog input signal, the feedback analog signal, and the loop filter coefficient;
a first integrator coupled with the first summer, wherein the first integrator is configured to generate a first integrated difference signal based on the difference signal;
a second integrator coupled with the first integrator, wherein the second integrator is configured to generate a second integrated difference signal based on the first integrated difference signal; and
a second summer coupled with the second integrator, wherein the second summer is configured to generate the loop filter analog signal based on the second integrated difference signal.

16. The delta-sigma modulator of claim 15, wherein the transconductor is configured to generate the loop filter coefficient based on the first integrated difference signal and the loop filter analog signal received from the loop filter.

17. The delta-sigma modulator of claim 16, wherein the second integrator has a feed forward gain path configured to generate an integrated gain signal, wherein the second summer is configured to generate the loop filter analog signal further based on the integrated gain signal.

18. A method comprising:
   generating a current signal based on an input voltage signal received from a loop filter of a delta-sigma modulator,
   setting a coarse tune step and a fine tune step of a current scaling stage, wherein the current scaling stage has a scaling factor based on a ratio of the coarse tune step and the fine tune step, and the scaling factor achieves a particular transconductance; and
   scaling, by the current scaling stage, the current signal by the scaling factor.

19. The method of claim 18, further comprising setting the loop filter coefficient by adjusting the scaling factor to place a notch frequency of the delta-sigma modulator at about an intermediate frequency of an analog signal.

20. The method of claim 18, wherein setting the course tune step and the fine tune step comprises selectively switching transistors in or out of a transistor array.

21. The method of claim 18, further comprising:
   dynamically adjusting the scaling factor based on a frequency of the input signal to the delta sigma modulator.

22. The method of claim 18, further comprising:
   generating a loop filter analog signal based on an analog signal, a feedback analog signal, and the loop filter coefficient; and
   generating a digital signal based on the loop filter analog signal.

23. The method of claim 18, wherein
   setting the coarse tune step sets a resistance sub-range that includes a particular resistance for setting the loop filter coefficient; and
   setting the fine-tune step sets the particular resistance within the resistance sub-range.

24. The transconductor of claim 1, further configured to generate multiple outputs with different transconductances to implement multiple loop filter coefficients.

25. The transconductor of claim 1, further comprising:
   a further current scaling stage configured to scale a further current signal by a different scaling factor to achieve a different transconductance.

26. The transconductor of claim 1, wherein the coarse tune step sets a current scaling ratio, and the fine tune step achieves a particular notch frequency placement.

27. The delta-sigma modulator of claim 8, wherein the voltage-to-current converter stage includes multiple input resistors to receive multiple input signals from the loop filter, and the current scaling stage includes multiple coarse tune and fine tune mechanisms to generate multiple outputs and implement multiple loop filter coefficients.

28. The transconductor of claim 1, wherein the coarse tune step of the coarse tune mechanism and the fine tune step of the fine tune mechanism are set by digital control bits.

29. The delta-sigma modulator of claim 12, wherein:
   each coarse tune transistor is controlled by a coarse tune bit; and
   each fine tune transistor is controlled by a fine tune bit.

30. The method of claim 18, wherein the coarse tune step and the fine tune step are set by digital control bits.

* * * * *